(12) United States Patent
Seo

(10) Patent No.: US 7,421,262 B2
(45) Date of Patent: Sep. 2, 2008

(54) TUNING METHOD AND APPARATUS FOR REDUCING INTERFERENCE BETWEEN ADJACENT CHANNELS

(75) Inventor: Dong-Uk Seo, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 467 days.

(21) Appl. No.: 11/282,601

(22) Filed: Nov. 21, 2005

(65) Prior Publication Data

US 2006/0111063 A1 May 25, 2006

(30) Foreign Application Priority Data

Nov. 23, 2004 (KR) .................. 10-2004-0096583

(51) Int. Cl.
*H04B 1/16* (2006.01)
(52) U.S. Cl. ............... 455/180.1; 455/188.1; 455/266; 348/731
(58) Field of Classification Search ............ 455/130, 455/180.1, 188.1, 188.2, 230, 266, 296, 325, 455/317; 348/731, 732, 735
See application file for complete search history.

(56) References Cited

U.S. PATENT DOCUMENTS 6,876,401 B2* 4/2005 Yamamoto ........... 455/188.1
7,269,401 B2* 9/2007 Saito et al. ............ 455/230
2005/0020220 A1* 1/2005 Gamou ................. 455/132
2005/0181741 A1* 8/2005 Raj et al. ................ 455/73

* cited by examiner

Primary Examiner—Thanh C Le
(74) Attorney, Agent, or Firm—Robert E. Bushnell, Esq.

(57) ABSTRACT

A tuning method comprises: detecting a fundamental intermediate frequency $IF_0$ of a channel to be received; determining whether the fundamental intermediate frequency $IF_0$ is affected by an adjacent channel; when the fundamental intermediate frequency $IF_0$ is affected by the adjacent channel, detecting a tuning intermediate frequency that is not affected by the adjacent channel while changing the fundamental intermediate frequency $IF_0$; when there is no variable intermediate frequency that is not affected by the adjacent channel, detecting a variable intermediate frequency that is least affected by the adjacent channel as the tuning intermediate frequency; and tuning the channel using the tuning intermediate frequency. A tuning apparatus comprises: a tuner for detecting a fundamental intermediate frequency $IF_0$ of a channel to be received, a flash memory for storing a tuning algorithm, and a demodulator for detecting a tuning intermediate frequency while changing the fundamental intermediate frequency $IF_0$, and for tuning the channel using the tuning intermediate frequency based on a prescribed tuning algorithm, the tuning intermediate frequency being a variable intermediate frequency $IF_n$ that is not affected by an adjacent channel.

19 Claims, 5 Drawing Sheets

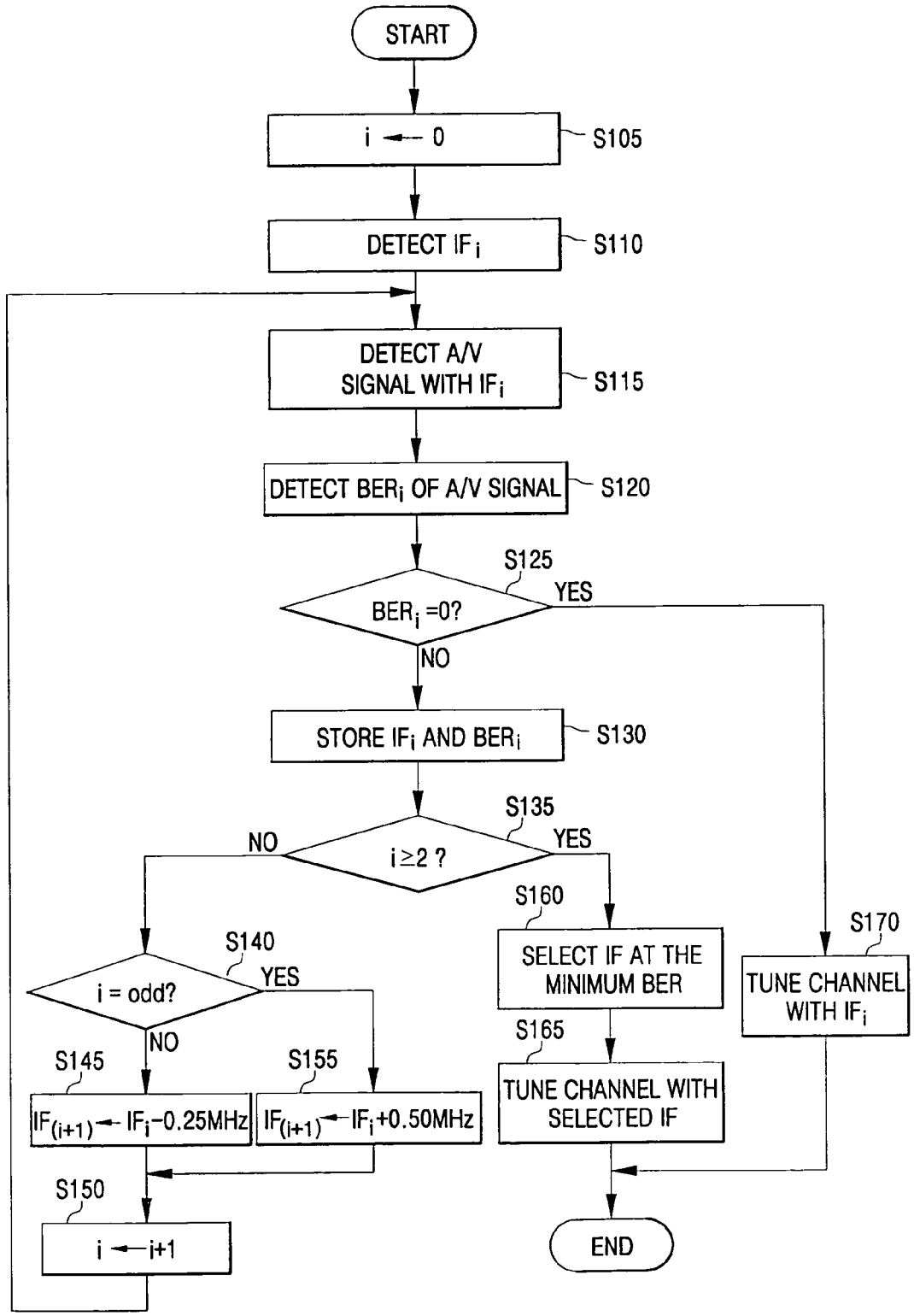

TUNING METHOD AND APPARATUS FOR REDUCING INTERFERENCE BETWEEN ADJACENT CHANNELS

CLAIM OF PRIORITY

This application makes reference to, incorporates the same herein, and claims all benefits accruing under 35 U.S.C. §119 from an application for TUNING METHOD AND APPARATUS FOR REDUCING INTERFERENCE BETWEEN ADJACENT CHANNELS earlier filed in the Korean Intellectual Property Office on Nov. 23, 2004 and there duly assigned Serial No. 2004-96583.

BACKGROUND OF THE INVENTION

1. Technical Field

The present invention relates to a digital tuning method and apparatus and, more particularly, to a tuning method and apparatus for reducing interference between an analog channel and a digital channel that are adjacent to each other.

2. Related Art

With the beginning of digital broadcasting service, the number of digital and analog broadcasting channels transmitted over terrestrial, cable, satellite, and/or the like is increasing and amounts to 100 or more. In order to receive a number of broadcasting signals of such channels, a digital tuner is necessarily required.

The digital tuner is a tuner which is capable of receiving digital satellite broadcast directly, and not via a satellite repeater station. The use of the digital tuner allows high image quality, high fidelity, and voice broadcasting, as well as a solution to poor reception. The digital tuner may be embedded in a set-top box (STB) or in a television.

The digital tuner has a disadvantage in that there is a high probability that an error will occur in a video stream or audio stream of a digital broadcasting signal upon receiving a digital broadcasting signal that is adjacent to an analog broadcasting signal. This is due to the adverse influence of an analog broadcasting signal having a relatively higher signal level, and this causes degradation of quality of service for the digital broadcasting service.

SUMMARY OF THE INVENTION

The present invention has been developed to solve the aforementioned problems. It is an object of the present invention to provide an apparatus and method which are capable of enhancing quality of service for a digital broadcasting service by enhancing the reception state of a digital broadcasting signal.

It is another object of the present invention to provide an apparatus and method for reducing the adverse influence of an adjacent analog signal on a digital broadcasting signal in a digital tuner.

It is yet another object of the present invention to provide an apparatus and method for reducing the adverse influence of an adjacent analog broadcasting signal by changing the intermediate frequency of the digital broadcasting signal.

According to an aspect of the present invention, there is provided a tuning method which includes: detecting a fundamental intermediate frequency $IF_0$ of a channel to be received; determining whether the fundamental intermediate frequency $IF_0$ is affected by an adjacent channel; when the fundamental intermediate frequency $IF_0$ is affected by the adjacent channel, detecting a tuning intermediate frequency that is not affected by the adjacent channel while changing the fundamental intermediate frequency $IF_0$; when there is no variable intermediate frequency that is not affected by the adjacent channel, detecting a variable intermediate frequency that is least affected by the adjacent channel as the tuning intermediate frequency; and tuning the channel using the tuning intermediate frequency.

Preferably, determining whether the fundamental intermediate frequency $IF_0$ is affected by an adjacent channel includes determining that the fundamental intermediate frequency $IF_0$ is not affected by the adjacent channel, when a bit error rate (BER) of a signal demodulated with the fundamental intermediate frequency $IF_0$ is smaller than a predetermined reference value for determining whether there is an error, or when the bit error rate (BER) of the signal demodulated with the fundamental intermediate frequency $IF_0$ is 0.

Preferably, detecting the tuning intermediate frequency includes: repeatedly determining whether a changed variable intermediate frequency $IF_n$ is affected by the adjacent channel while changing the fundamental intermediate frequency $IF_0$ to the left and/or right; and when it is determined that the variable intermediate frequency is not affected by the adjacent channel, detecting the variable intermediate frequency as the tuning intermediate frequency.

Preferably, the step of repeatedly determining whether the changed variable intermediate frequency $IF_n$ is affected by the adjacent channel further includes storing the variable intermediate frequency $IF_n$ and a corresponding bit error rate $BER_n$, and detecting the variable intermediate frequency includes detecting the variable intermediate frequency $IF_n$ when the stored bit error rate $BER_n$ is minimal as the tuning intermediate frequency.

According to another aspect of the present invention, there is provided a tuning apparatus, comprising: a tuner for detecting a fundamental intermediate frequency $IF_0$ of a channel to be received; a flash memory for storing a prescribed tuning algorithm; and a demodulator for detecting a tuning intermediate frequency while changing the fundamental intermediate frequency $IF_0$ to the left and/or right, and tuning the channel using the tuning intermediate frequency based on the tuning algorithm, the tuning intermediate frequency being a variable intermediate frequency $IF_n$ that is not affected by an adjacent channel.

Preferably, the demodulator tunes the channel using the fundamental intermediate frequency $IF_0$ when the fundamental intermediate frequency $IF_0$ is not affected by the adjacent channel.

Preferably, the demodulator detects a variable intermediate frequency that is least affected by the adjacent channel as the tuning intermediate frequency when there is no variable intermediate frequency $IF_n$ that is not affected by the adjacent channel.

Preferably, the demodulator determines that the fundamental intermediate frequency $IF_0$ is not affected by the adjacent channel when a bit error rate (BER) of a signal demodulated with the fundamental intermediate frequency $IF_0$ is smaller than a predetermined reference value for determining whether there is an error.

Preferably, the demodulator determines that the fundamental intermediate frequency $IF_0$ is not affected by the adjacent channel when a bit error rate (BER) of a signal demodulated with the fundamental intermediate frequency $IF_0$ is 0.

BRIEF DESCRIPTION OF THE DRAWINGS

The above and other features and advantages of the present invention will become more apparent from the following detailed description of preferred embodiments of the invention, with reference to the attached drawings, in which:

FIG. 4 is a flow diagram of a tuning method according to an embodiment of the present invention.

DETAILED DESCRIPTION OF THE INVENTION

The present invention will now be described more fully hereinafter with reference to the accompanying drawings, in which preferred embodiments of the invention are shown. This invention may, however, be embodied in different forms, and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Figure 1:
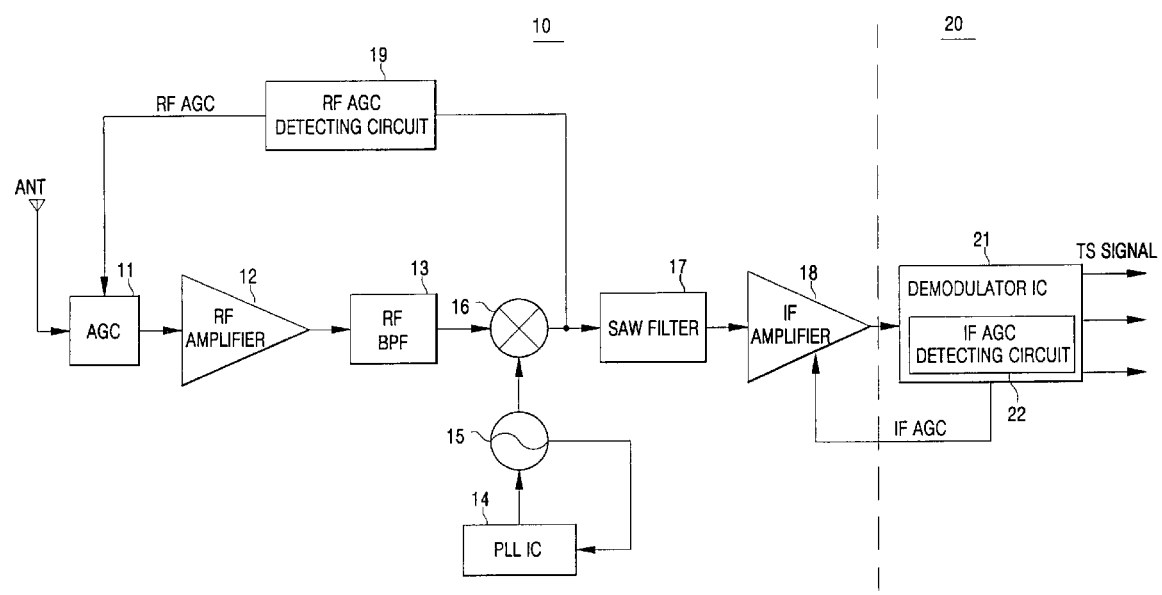
FIG. 1 schematically illustrates the configuration of a digital tuner.

FIG. 1 schematically illustrates the configuration of a digital tuner. Referring to FIG. 1, the digital tuner includes a tuning unit 10 and a demodulator 20. The tuning unit 10 includes an automatic gain controller (hereinafter, referred to as 'AGC') 11, a radio frequency amplifier (hereinafter, referred to as 'RF amplifier') 12, an RF band pass filter (hereinafter, referred to as 'RF BPF') 13, a phase locked loop integrated circuit (hereinafter, referred to as 'PLL IC') 14, a local oscillator 15, a mixer 16, a saw filter 17, an intermediate frequency amplifier (hereinafter, referred to as 'IF amplifier') 18, and a radio frequency automatic gain control detecting circuit (hereinafter, referred to as 'RF AGC detecting circuit') 19. The demodulator 20 includes a demodulator IC 21 having an intermediate frequency automatic gain control detecting circuit (hereinafter, referred to as 'IF AGC detecting circuit') 22.

The AGC 11 performs automatic gain control so as to provide an image signal with a uniform output, even when the radio frequency signal received by the antenna (ANT) varies in size.

The RF amplifier 12 amplifies the radio frequency signal outputted by the AGC 11.

The RF BPF 13 selects a desired bandwidth of the radio frequency signal amplified by the RF amplifier 12.

The PLL IC 14 stores channel data therein, and outputs a control voltage to the local oscillator 15 based on an external control input.

The local oscillator 15 has three divided bands that are switched therebetween according to a frequency obtained upon tuning a channel. The local oscillator 15 generates a predetermined oscillation frequency according to the control voltage from the PLL IC 14, and outputs the generated oscillation frequency to the mixer 16.

The mixer 16 mixes the radio frequency signal selected by the RF BPF 13 and the oscillation frequency generated by the local oscillator 15 so as to output an intermediate frequency (IF) signal.

The saw filter 17 filters the IF signal received from the mixer 16.

The IF amplifier 18 amplifies the filtered IF signal received from the saw filter 17.

The RF AGC detecting circuit 19 controls the gain of the AGC 11 when a strong electric field signal is received.

The demodulator IC 21 demodulates the IF signal received from IF amplifier 18 and outputs a transport stream (hereinafter, referred to as 'TS') signal.

The IF AGC detecting circuit 22 controls the gain of the IF amplifier 18 when a weak electric field signal is received.

The operation of the digital tuner having such a configuration will now be described.

First, signals in the radio frequency band received by the antenna ANT pass through the AGC 11, the RF amplifier 12, and the RF BPF 13, thus selecting an RF signal of one broadcasting frequency. The mixer 16 mixes the selected RF signal with the oscillation frequency generated by the local oscillator 15, and outputs an IF signal.

More specifically, the local oscillator 15 outputs an oscillation frequency to the mixer 16 according to the control voltage from the PLL IC 14, and the mixer 16 mixes the RF signal input from the RF BPF 13 with the oscillation frequency input from the local oscillator 15 so as to output the IF signal.

The IF signal from the mixer 16 is filtered and amplified via the saw filter 17 and the IF amplifier 18, respectively, and is provide as an input to the demodulator IC 21. The demodulator IC 21 then demodulates the inputted IF signal so as to output the TS signal.

When a strong electric field signal is received by the antenna (ANT), the RF AGC detecting circuit 19 operates and controls the automatic gain control of the AGC 11. Conversely, when a weak electric field signal is received, the gain of the IF amplifier 18 is automatically controlled according to a voltage output from the demodulator IC 21.

Figure 2:
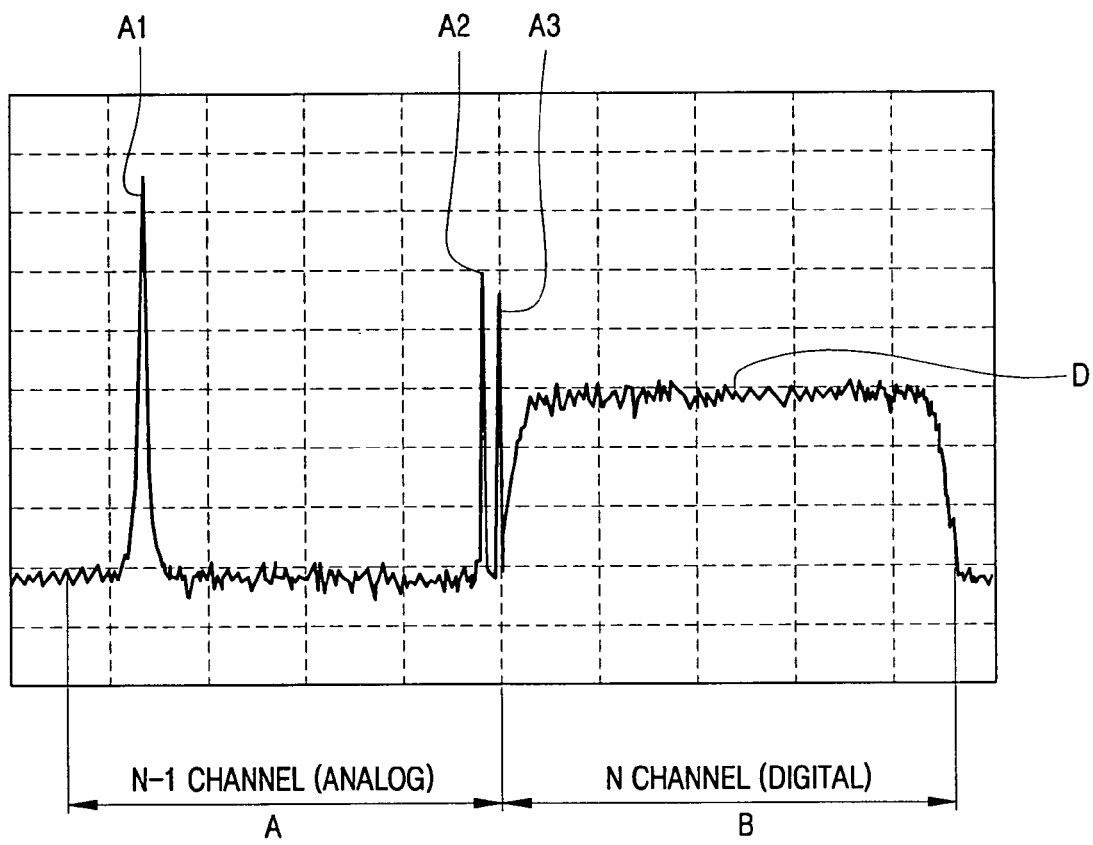
FIG. 2 is a waveform diagram for an analog channel and a digital channel that are adjacent to each other.

FIG. 2 is a waveform diagram for an analog channel and a digital channel that are adjacent to each other.

If a digital broadcasting signal and an analog broadcasting signal are transferred simultaneously, the digital broadcasting signal and the analog broadcasting signal will alternately occupy the channel, as shown in FIG. 2. The digital broadcasting signal is always transmitted at a level less than that of the analog broadcasting signal so as not to affect the existing analog broadcasting signal.

Further referring to FIG. 2, an N-1 channel or A region carries the analog broadcasting signal, and an N channel or B region carries the digital broadcasting signal. A video signal A1, a first audio signal A2, and a second audio signal A3 of the analog broadcasting signal are positioned at specific positions in a bandwidth assigned to the analog broadcasting signal, while the digital broadcasting signal D is positioned over an overall bandwidth assigned to the digital broadcasting signal.

For this reason, if the video signal A1 and the first and second audio signals A2 and A3 of the analog broadcasting signal are adjacent to a channel boundary, any one of the signals interferes with the digital broadcasting signal D.

In the specific case shown in FIG. 2, the second audio signal A3 interferes with the digital broadcasting signal D.

If any one of the video signal A1 and the first and second audio signals A2 and A3 of the analog broadcasting signal is adjacent to the digital broadcasting signal as stated above, the digital tuner shown in FIG. 1 will recognize the analog broadcasting signal at a level higher than that of the digital broadcasting signal, prior to recognizing the level of the digital broadcasting signal that the RF AGC detecting circuit 19 desires to receive, due to a disturbing signal level larger than a certain level, thus outputting an abnormal AGC voltage. Accordingly, when the adjacent analog broadcasting signal has a very high level upon receiving the digital broadcasting signal, the reception state is bad due to interference generated by the adjacent channel. In FIG. 2, the second audio signal A3 of the analog broadcasting signal greatly affects the digital broadcasting signal D because the former is adjacent to the latter with only tens of kHz therebetween.

As a result, the digital tuner has a disadvantage in that there is a high probability that an error will occur in a video stream or audio stream of a digital broadcasting signal upon receiving a digital broadcasting signal that is adjacent to an analog broadcasting signal. This is due to the adverse influence of an analog broadcasting signal having a relatively higher signal level, and this causes degradation of quality of service for the digital broadcasting service.

Figure 3:
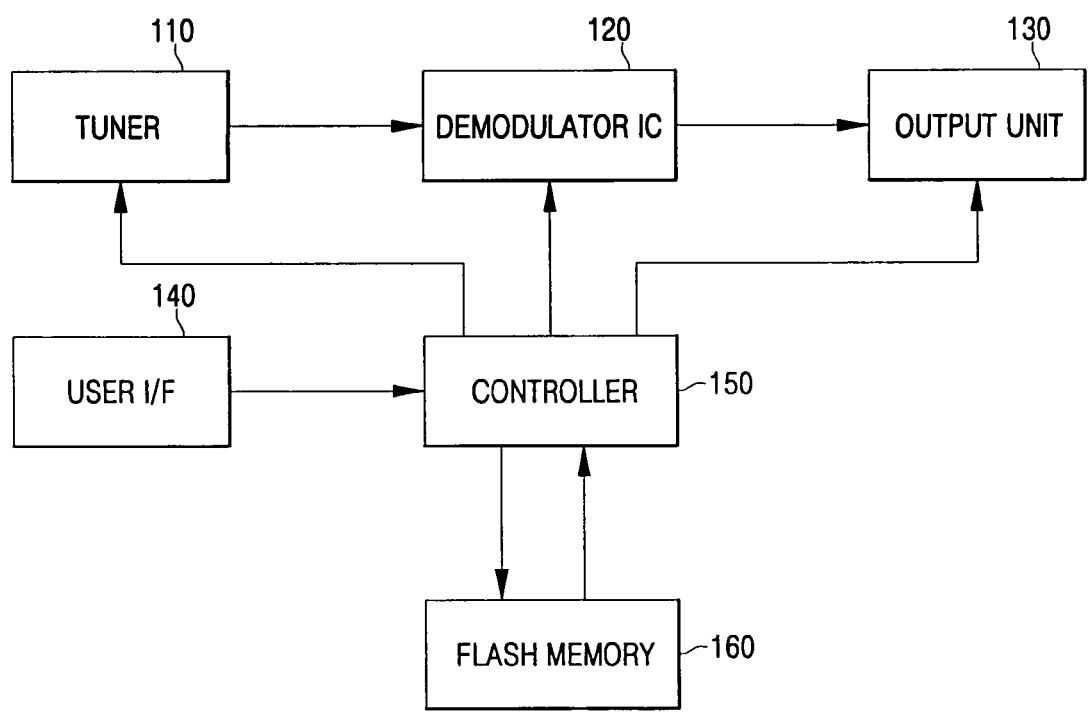
FIG. 3 is a schematic block diagram of a tuning apparatus according to an embodiment of the present invention.

FIG. 3 is a schematic block diagram of a tuning apparatus according to an embodiment of the present invention. Referring to FIG. 3, a tuning apparatus 100 according to an embodiment of the present invention includes a tuner 110, a demodulator IC 120, an output unit 130, a user interface (user I/F) 140, a controller 150, and a flash memory 160.

The tuner 110 receives a digital broadcasting signal in a high frequency band of a channel set under the control of the controller 150, converts the received digital broadcasting signal to an IF signal, and filters, amplifies and outputs the IF signal. In operation, the tuner 110 receives channel information and RF and IF AGC values from the controller 150.

The demodulator IC 120 demodulates the IF signal received from the tuner 110, and outputs a transport stream (hereinafter, referred to as 'TS') signal. In particular, the demodulation IC 120 determines whether there is interference with the adjacent channel, and changes the IF signal until there is minimal interference. In order to realize this functionality, the demodulator IC 120 selects an IF signal in which the digital broadcasting signal has the smallest bit error rate (BER) while changing the IF signal based on a pre-stored tuning algorithm. Furthermore, the demodulator IC 120 generates and outputs the TS signal using the IF signal.

The output unit 130 controls the output of the TS signal received from the demodulator IC 120. In order to realize this functionality, the output unit 130 includes a number of ports (e.g., audio/video (A/V) ports, universal serial bus (USB) ports, and Internet ports).

The user I/F 140 inputs a user's operational signal to the controller 150.

The controller 150 controls the operations of the tuner 110, the demodulator IC 120, and the output unit 130 based on the user's operational signal input as received via the user I/F 140, or based on operation information pre-stored in the flash memory 160 (e.g., a tuning algorithm and channel information).

The flash memory 160 stores the operation information (e.g., the tuning algorithm and the channel information) for controlling the operation of the tuning apparatus 100.

FIG. 4 is a flow diagram of a tuning method according to an embodiment of the present invention. The tuning method according to the embodiment of the present invention will now be described with reference to FIGS. 3 and 4.

First, the controller 150 initializes a variable i for differentiating between a fundamental IF frequency and variable IF frequencies (i←0) (S105). For example, in order to differentiate between the respective IF frequencies, the fundamental IF frequency is denoted by $IF_0$, a first variable IF frequency is denoted by $IF_1$, and a second variable IF frequency is denoted by $IF_2$, wherein the value of the variable i is incremented by '1' each time the fundamental IF frequency is changed.

Next, the tuner 110 detects an IF frequency of a digital broadcasting channel to be received, for example, an N channel (S110). At this time, the IF frequency detected by the tuner 110 is referred to as the fundamental IF frequency, and this fundamental IF frequency is denoted by $IF_0$ since the value of the variable i has been set to '0' in S105.

The demodulator IC 120, which receives the fundamental IF frequency $IF_0$ from the tuner 110, uses the fundamental IF frequency $IF_0$ to detect audio and video (A/V) signals of the N channel (S115). That is, the demodulator IC 120 uses the fundamental IF frequency $IF_0$ to demodulate the N channel.

Under the control of the controller 150 using the tuning algorithm pre-stored in the flash memory 160, the demodulator IC 120 determines whether the fundamental IF frequency $IF_0$ is affected by the adjacent channel and, if the fundamental IF frequency $IF_0$ is affected by the adjacent channel, the demodulator IC 120 changes the fundamental IF frequency $IF_0$ until it is least affected by the adjacent channel. The operation of the demodulator IC 120 will now be discussed in detail.

First, the demodulator IC 120 detects the bit error rate (BER) of the A/V signal (S120), which was detected by using the fundamental IF frequency $IF_0$ in S115. The demodulator IC 120 then determines whether the value of the BER is 0 (S125). That is, the demodulator IC 120 detects the BER of the N channel signal (referred to as '$BER_0$') tuned with the fundamental IF frequency $IF_0$, and determines whether the value of the $BER_0$ is 0.

The latter process (S125) is a process of determining whether the fundamental IF frequency $IF_0$ is affected by an adjacent channel, wherein the comparison value or the reference value is not limited to zero but may vary with the characteristics of the device. For example, the reference value is a value used to determine whether there is an error in the signal demodulated with the corresponding IF frequency. If the BER of the signal demodulated with the corresponding IF frequency is smaller than the reference value, the demodulator IC 120 determines that the IF frequency is not affected by the adjacent channel.

The example of FIG. 4 describes the case wherein the comparison value is 0. If it is determined in S125 that the $BER_0$ value is 0, the demodulator IC 120 determines that the fundamental IF frequency $IF_0$ is not affected by the adjacent channel, and tunes the N channel using the fundamental IF frequency $IF_0$ (S170).

On the other hand, if it is determined in S125 that the $BER_0$ value is non-zero, the demodulator IC 120 stores the fundamental IF frequency $IF_0$ and the corresponding $BER_0$ (S130). This is done in order to carry out subsequent comparison with BER values of variable IF frequencies to select an IF frequency at a minimum BER value.

After storing the fundamental IF frequency $IF_0$ and the corresponding bit error rate $BER_0$, the demodulator IC 120 determines whether the value of the variable 'i' is 2 or greater (S135). The variable 'i' is a variable for differentiating between the fundamental IF frequency $IF_0$ and the variable IF frequencies, and indicates how many times the fundamental IF frequency is changed by counting the number of times that a change has taken place. FIG. 4 shows an example in which the fundamental IF frequency $IF_0$ is shifted once to each of the left and/or right, and BER values corresponding to the shifted IF frequencies and the BER value corresponding to the fundamental IF frequency $IF_0$ are compared to each other, thus selecting an IF frequency at a minimum BER value. That is, FIG. 4 shows an example in which the fundamental IF frequency $IF_0$ is changed two times, the BER values at the fundamental IF frequency $IF_0$ is compared to the BER values at the variable IF frequencies, and the IF frequency at the minimum BER value is selected.

Thus, in S135, the demodulator IC 120 determines whether the 'i' value is 2 or greater. In the case of shifting the fundamental IF frequency $IF_0$ two times to each of the left and/or right (a total of four shifts), comparing the BER values corresponding to the shifted IF frequencies to the BER value corresponding to the fundamental IF frequency $IF_0$, and selecting the IF frequency at the minimum BER value, the demodulator IC 120 will determine in S135 whether the 'i' value is 4 or more.

It is determined in S135 whether the 'i' value is 2 or more and, since the value of the initial 'i' is 0, the demodulator IC 120 proceeds to S140 where the demodulation IC 120 determines whether the 'i' value is an odd number. This is intended to differentiate between 1 and 2, since the 'i' value is either 1 or 2 when the fundamental IF frequency $IF_0$ is changed two times.

Since the initial value of the 'i' is 0 in S140, the 'i' value is not an odd number. Accordingly, the demodulator IC 120 proceeds to S145 where the demodulator IC 120 shifts the fundamental IF frequency $IF_0$ to the left. FIG. 4 shows an exemplary case in which the fundamental IF frequency $IF_0$ is shifted by 0.25 MHz to the left. Equation 1 below shows an example in which the fundamental IF frequency $IF_0$ is shifted by 0.25 MHz to the left so as to calculate a first variable IF frequency $IF_1$.

$$IF_{(i+1)} = IF_i - 0.25 \text{ MHz} \qquad \text{<Equation 1>}$$

In Equation 1, since the 'i' value is 0, the first variable IF frequency $IF_1$ is obtained by subtracting 0.25 MHz from the fundamental IF frequency $IF_0$. The 0.25 MHz value is a value determined by experiments under the situation in Korea where a fundamental IF frequency of 44 MHz is primarily used. Accordingly, a shift range of the fundamental IF frequency is not limited to the value 0.25 MHz. The shift range is variable according to the range of the fundamental IF frequency used in each country or device.

After calculating the first variable IF frequency, the demodulator IC 120 increments the variable 'i' by '1' (S150), and performs the process of detecting the A/V signal (S115) and the process of detecting the bit error rate BER1 of the A/V signal (S120), based on the first variable IF frequency $IF_1$. Furthermore, the demodulator IC 120 determines in S125 whether the first variable IF frequency is affected by the adjacent channel. For example, the demodulator IC 120 determines whether a bit error rate BER1 of the A/V signal detected with the first variable IF frequency is 0, as in the case of the fundamental IF frequency. If it is determined that the bit error rate BER1 of the A/V signal detected with the first variable IF frequency is 0, the demodulator IC 120 determines that the first variable IF frequency $IF_1$ is not affected by the adjacent channel, and tunes the N channel using the first variable IF frequency $IF_1$ (S170).

On the other hand, if it is determined in S125 that the BER1 value is non-zero, the demodulator IC 120 stores the first variable IF frequency $IF_1$ and the corresponding bit error rate BER1 (S130). This is intended to facilitate selection of the IF frequency at the minimum BER value, as in the case where the A/V signal detection frequency is the fundamental IF frequency $IF_0$.

After storing the first variable IF frequency $IF_1$ and the corresponding bit error rate BER1, the demodulator IC 120 determines whether the value of the variable 'i' is 2 or more (S135). At this time, 'i' has a value of 1 since it has been incremented by '1' in step S150. Thus, it is determined in S135 whether the 'i' value is 2 or more and, since the current 'i' value is '1', the demodulator IC 120 proceeds to S140 where the demodulator IC 120 determines whether the 'i' value is an odd number.

In S140, since the current 'i' value is '1', the 'i' value is an odd number. Accordingly, the demodulator IC 120 proceeds to S155 where the demodulator IC 120 shifts the fundamental IF frequency $IF_0$ to the right. In the example of FIG. 4, the first variable IF frequency $IF_1$ has been stored in the '$IF_i$' via step S145. Accordingly, in S155, a process should be performed in which the first variable IF frequency $IF_1$ is shifted back to a position of the fundamental IF frequency $IF_0$, and is again shifted by the same value as the left shift value to the right. In FIG. 4, there is shown an example in which the fundamental IF frequency $IF_0$ is shifted by 0.25 MHz to the left in S145. Accordingly, in S155, the demodulator IC 120 should shift the first variable frequency $IF_1$ to the left by 0.25 MHz two times. That is, in S155, the demodulator IC 120 calculates the second variable IF frequency $IF_2$ by shifting the first variable frequency $IF_1$ to the right by 0.50 MHz, as in the following Equation 2.

$$IF_{(i+1)} = IF_i + 0.50 \text{ MHz} \qquad \text{<Equation 2>}$$

In Equation 2, since 'i' value is '1', the second variable IF frequency $IF_2$ is obtained by summing the first variable IF frequency $IF_1$ and 0.50 MHz. At this time, the 0.50 MHz value is two times the left shift value, and may vary with the left shift value.

After calculating the second variable IF frequency $IF_2$, the demodulator IC 120 increments the variable 'i' by '1' (S150), and then performs the process of detecting the A/V signal (S115) and the process of detecting the bit error rate $BER_2$ of the A/V signal (S120) based on the second variable IF frequency $IF_2$. The demodulator IC 120 determines, in S125, whether the second variable IF frequency is affected by the adjacent channel. For example, the demodulator IC 120 determines whether the bit error rate $BER_2$ of the A/V signal detected with the second variable IF frequency is 0, as in the cases of the fundamental IF frequency and the first variable IF frequency. If it is determined that the BER of the A/V signal detected with the second variable IF frequency is 0, the demodulator IC 120 determines that the second variable IF frequency $IF_2$ is not affected by the adjacent channel, and tunes the N channel with the second variable IF frequency $IF_2$ (S170).

On the other hand, if it is determined in S125 that the $BER_2$ value is non-zero, the demodulator IC 120 stores the second variable IF frequency $IF_2$ and the corresponding bit error rate $BER_2$ (S130). This is intended to select the IF frequency at the minimum BER value, as in the cases where the A/V signal detection frequency is the fundamental IF frequency $IF_0$ and where it is the first fundamental IF frequency $IF_1$.

After storing the second variable IF frequency $IF_2$ and the corresponding bit error rate $BER_2$, the demodulator IC 120 determines whether the value of the variable 'i' is 2 or more (S135). At this time, the 'i' has a value of 2 since it has been incremented by '1' two times in step S150, and thus, 'i' has a value of 2. The demodulator IC 120 determines in S135 whether the 'i' value is 2 or more and, since the current 'i' value is 2, the demodulator IC 120 proceeds to S160 where the demodulator IC 120 selects the smallest one of the BER values, $BER_0$, BER1 and $BER_2$, which have been stored in step S130 three times (i.e., at the fundamental IF frequency $IF_0$, at the first variable IF frequency $IF_1$, and at the second variable IF frequency $IF_2$), and selects a corresponding IF frequency. For example, if the BER1 of the BER values is minimal, the demodulator IC 120 selects the first variable IF Frequency $IF_1$. And, the demodulator IC 120 tunes the N channel with the selected IF Frequency $IF_1$.

In FIG. 4, the case has been described wherein the fundamental IF frequency $IF_0$ is first shifted to the left when the bit error rate $BER_0$ of the A/V signal detected with the fundamental IF frequency $IF_0$ is non-zero. However, the present invention is not limited to the case in which the fundamental IF frequency $IF_0$ is first shifted to the left. In other words, since the present invention is directed to the apparatus and method for detecting the IF frequency least affected by the adjacent RF signal while shifting the fundamental IF frequency $IF_0$ to the left and/or right, the present invention is not limited to the direction to which and the amount by which the fundamental IF frequency $IF_0$ is shifted.

Further, in the example of FIG. 4, a method has been used in which the number of times that the fundamental IF frequency has been changed is counted, and the value of the variable 'i' having an initial value of 0 is incremented by '1' each time the fundamental IF frequency is changed once to differentiate between the fundamental IF frequency and the variable IF frequencies. However, the present invention is not limited to the method with the variable i.

Figure 5A:
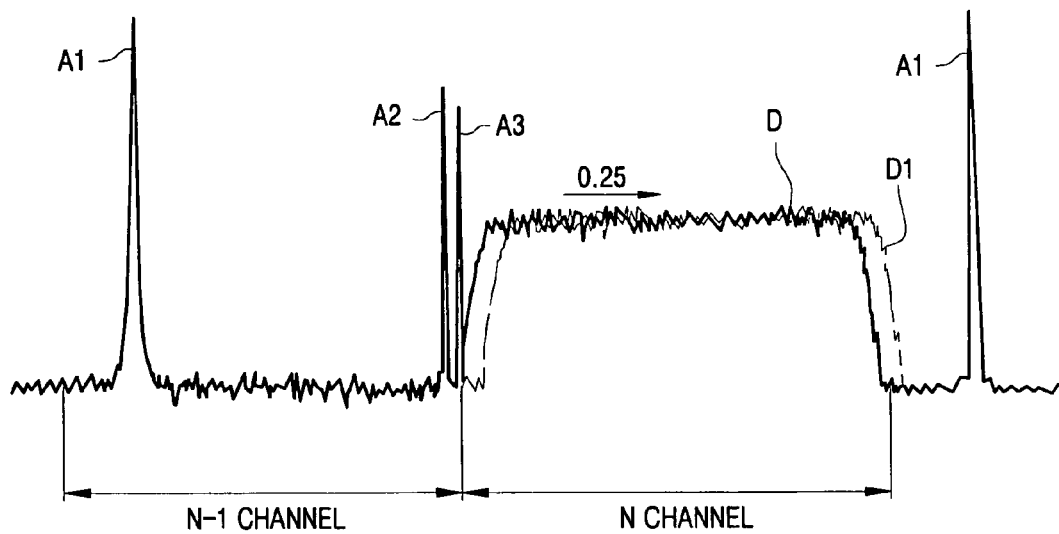
FIGS. 5A and 5B are waveform diagrams illustrating the case wherein an intermediate frequency of a digital channel is shifted to the left and/or right according to an embodiment of the present invention.
Figure 5B:
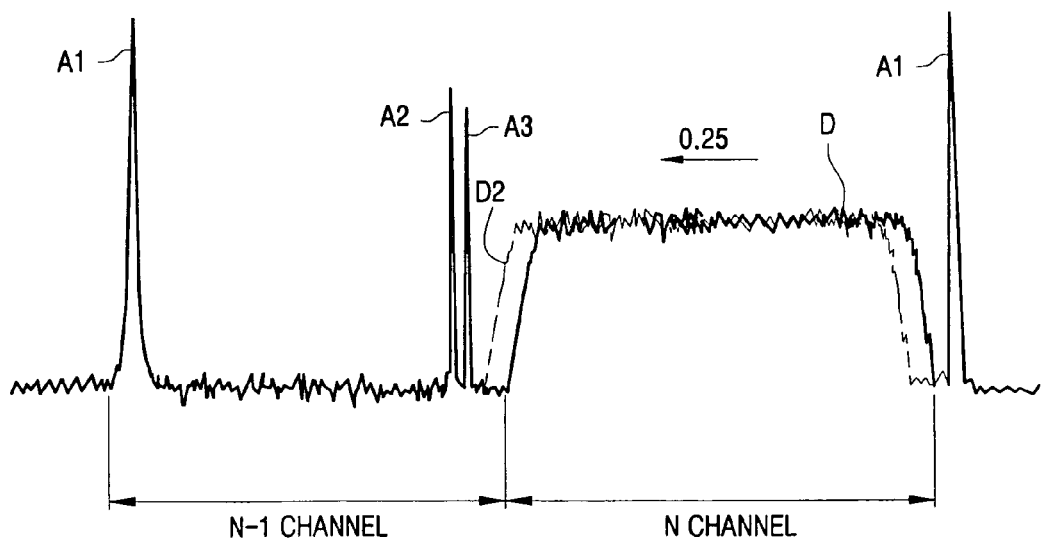

FIGS. 5A and 5B are waveform diagrams for the case wherein an intermediate frequency of a digital channel is shifted to the left and/or right according to an embodiment of the present invention.

FIGS. 5A and 5B illustrate cases where an 'N-1 channel' as an analog broadcasting signal and an 'N channel' as a digital broadcasting signal are adjacent to each other. In particular, FIG. 5A illustrates an example in which an IF frequency of the N channel is shifted to the right by 0.25 MHz when a second audio signal A3 of the analog broadcasting signal of the 'N-1 channel' is adjacent to the left side of the digital broadcasting signal D of the 'N channel,' wherein the analog broadcasting signal of the 'N-1 channel' contains a video signal A1 and first and second audio signals A2 and A3. FIG. 5B illustrates an example in which the IF frequency of the N channel is shifted to the left by 0.25 MHz when the video signal A1 of the analog broadcasting signal adjacent to the right side of the digital broadcasting signal D of the 'N channel' affects the digital broadcasting signal D of the 'N channel'.

Although exemplary embodiments of the present invention have been illustrated, it will be apparent that various changes may be made to the present invention without departing from the spirit and scope of the present invention. Therefore, the present invention should not be limited to the illustrated embodiments, but instead should be determined by the claims and equivalents thereof.

As described above, the tuning apparatus and method of the present invention have the advantage of minimizing the influence of an adjacent channel on a signal of a channel to be received by detecting an intermediate frequency least affected by a radio frequency signal adjacent to the channel to be received while changing the intermediate frequency of the channel to be received, and by tuning to the channel with the intermediate frequency. In particular, the present invention has an advantage in that the digital broadcasting signal can be less affected by the adjacent analog broadcasting signal. Furthermore, with the present invention, it is possible to enhance the quality of service for a digital broadcasting service by enhancing the reception state of the digital broadcasting signal.

Although preferred embodiments of the present invention have been described, it will be understood by those skilled in the art that the present invention should not be limited to the described preferred embodiments. Rather, various changes and modifications can be made within the spirit and scope of the present invention, as defined by the following claims.

What is claimed is:

1. A tuning method, comprising:
   detecting a fundamental intermediate frequency $IF_0$ of a channel to be received;
   determining whether the fundamental intermediate frequency $IF_0$ is affected by an adjacent channel;
   when the fundamental intermediate frequency $IF_0$ is affected by the adjacent channel, detecting a tuning intermediate frequency that is not affected by the adjacent channel while changing the fundamental intermediate frequency $IF_0$;
   when there is no variable intermediate frequency that is not affected by the adjacent channel, detecting a variable intermediate frequency that is least affected by the adjacent channel as the tuning intermediate frequency; and
   tuning the channel using the tuning intermediate frequency.

2. The method according to claim 1, wherein the step of determining whether the fundamental intermediate frequency $IF_0$ is affected by the adjacent channel comprises determining that the fundamental intermediate frequency $IF_0$ is not affected by the adjacent channel when a bit error rate (BER) of a signal demodulated with the fundamental intermediate frequency $IF_0$ is smaller than a predetermined reference value.

3. The method according to claim 1, wherein the step of determining whether the fundamental intermediate frequency $IF_0$ is affected by the adjacent channel comprises determining that the fundamental intermediate frequency $IF_0$ is not affected by the adjacent channel when a bit error rate (BER) of a signal demodulated with the fundamental intermediate frequency $IF_0$ is 0.

4. The method according to claim 1, wherein the step of detecting the tuning intermediate frequency comprises:
   repeatedly determining whether a changed variable intermediate frequency $IF_n$ is affected by the adjacent channel while changing the fundamental intermediate frequency $IF_0$ to at least one of the left and the right; and
   determining that the variable intermediate frequency is the tuning intermediate frequency when it is determined that the variable intermediate frequency is not affected by the adjacent channel.

5. The method according to claim 4, wherein the step of repeatedly determining whether a changed variable intermediate frequency IFn is affected by the adjacent channel comprises determining that the variable intermediate frequency $IF_n$ is not affected by the adjacent channel when a bit error rate $BER_n$ of a signal demodulated with the variable intermediate frequency $IF_n$ is smaller than a predetermined reference value.

6. The method according to claim 5, wherein the step of repeatedly determining whether a changed variable intermediate frequency IFn is affected by the adjacent channel further comprises storing the variable intermediate frequency $IF_n$ and a corresponding bit error rate $BER_n$.

7. The method according to claim 4, wherein the step of repeatedly determining whether a changed variable intermediate frequency IFn is affected by the adjacent channel comprises determining that the variable intermediate frequency $IF_n$ is not affected by the adjacent channel when a bit error rate $BER_n$ of a signal demodulated with the variable intermediate frequency $IF_n$ is 0.

8. The method according to claim 7, wherein the step of repeatedly determining whether a changed variable intermediate frequency IFn is affected by the adjacent channel further comprises storing the variable intermediate frequency $IF_n$ and a corresponding bit error rate $BER_n$.

9. The method according to claim 8, wherein the step of detecting the variable intermediate frequency IFn that is at least affected by the adjacent channel comprises detecting the variable intermediate frequency $IF_n$ as the tuning intermediate frequency when the stored bit error rate $BER_n$ is minimal.

10. A tuning apparatus, comprising:
 a tuner for detecting a fundamental intermediate frequency $IF_0$ of a channel to be received;
 a flash memory for storing a prescribed tuning algorithm; and
 a demodulator for detecting a tuning intermediate frequency IFn that is not affected by an adjacent channel while changing the fundamental intermediate frequency $IF_0$ and for tuning the channel using the tuning intermediate frequency IFn based on the tuning algorithm.

11. The apparatus according to claim 10, wherein the demodulator tunes the channel using the fundamental intermediate frequency $IF_0$ when the fundamental intermediate frequency $IF_0$ is not affected by the adjacent channel.

12. The apparatus according to claim 10, wherein the demodulator detects a variable intermediate frequency that is least affected by the adjacent channel as the tuning intermediate frequency when there is no variable intermediate frequency $IF_n$ that is not affected by the adjacent channel.

13. The apparatus according to claim 10, wherein the demodulator determines that the fundamental intermediate frequency $IF_0$ is not affected by the adjacent channel when a bit error rate (BER) of a signal demodulated with the fundamental intermediate frequency $IF_0$ is smaller than a predetermined reference value.

14. The apparatus according to claim 10, wherein the demodulator determines that the fundamental intermediate frequency $IF_0$ is not affected by the adjacent channel when a bit error rate (BER) of a signal demodulated with the fundamental intermediate frequency $IF_0$ is 0.

15. The apparatus according to claim 10, wherein the demodulator detects the tuning intermediate frequency by:
 repeatedly determining whether a changed variable intermediate frequency $IF_n$ is affected by the adjacent channel while changing the fundamental intermediate frequency $IF_0$ to at least one of the left and the right; and
 determining that the variable intermediate frequency is the tuning intermediate frequency when it is determined that the variable intermediate frequency is not affected by the adjacent channel.

16. The apparatus according to claim 15, wherein the demodulator repeatedly determines whether a changed variable intermediate frequency IFn is affected by the adjacent channel by determining that the variable intermediate frequency $IF_n$ is not affected by the adjacent channel when a bit error rate $BER_n$ of a signal demodulated with the variable intermediate frequency $IF_n$ is smaller than a predetermined reference value.

17. The apparatus according to claim 15, wherein the demodulator repeatedly determines whether a changed variable intermediate frequency IFn is affected by the adjacent channel by determining that the variable intermediate frequency $IF_n$ is not affected by the adjacent channel when a bit error rate $BER_n$ of a signal demodulated with the variable intermediate frequency $IF_n$ is 0.

18. The apparatus according to claim 15, wherein, when the demodulator repeatedly determines whether a changed variable intermediate frequency IFn is affected by the adjacent channel, the demodulator stores the variable intermediate frequency $IF_m$ and a corresponding bit error rate $BER_m$.

19. The apparatus according to claim 18, wherein the demodulator determines that the variable intermediate frequency $IF_n$ is not affected by the adjacent channel by detecting the variable intermediate frequency $IF_n$ as the tuning intermediate frequency when the stored bit error rate $BER_n$ is minimal.

* * * * *